(12) United States Patent
Walukiewicz et al.

(10) Patent No.: US 10,128,410 B2
(45) Date of Patent: *Nov. 13, 2018

(54) MULTI-COLOR LIGHT EMITTING DEVICES WITH COMPOSITIONALLY GRADED CLADDING GROUP III-NITRIDE LAYERS GROWN ON SUBSTRATES

(71) Applicant: ROSESTREET LABS ENERGY, INC., Phoenix, AZ (US)

(72) Inventors: Wladyslaw Walukiewicz, Kensington, CA (US); Iulian Gherasoiu, Gilbert, AZ (US); Lothar Reichertz, Berkeley, CA (US)

(73) Assignee: ROSESTREET LABS ENERGY, INC., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/066,889

(22) Filed: Mar. 10, 2016

(65) Prior Publication Data

US 2017/0012172 A1    Jan. 12, 2017

Related U.S. Application Data

(63) Continuation of application No. 14/704,222, filed on May 5, 2015, now Pat. No. 9,312,430, which is a
(Continued)

(51) Int. Cl.
*H01L 33/32* (2010.01)
*H01L 29/778* (2006.01)
(Continued)

(52) U.S. Cl.
CPC ............ *H01L 33/32* (2013.01); *H01L 29/778* (2013.01); *H01L 33/007* (2013.01);
(Continued)

(58) Field of Classification Search
None
See application file for complete search history.

(56) References Cited

U.S. PATENT DOCUMENTS 5,045,896 A    9/1991  Ash et al.
5,874,747 A    2/1999  Redwing et al.
(Continued)

FOREIGN PATENT DOCUMENTS

WO    2013009552 A2    1/2013

OTHER PUBLICATIONS

Korean Intellectual Property Office; Patent Cooperation Treaty, PCT International Search Report; Issued for Application No. PCT/US2012/045482, dated Dec. 21, 2012; 3 pages; Korea.

(Continued)

*Primary Examiner* — Michael Lebentritt
(74) *Attorney, Agent, or Firm* — Greenberg Traurig LLP

(57) ABSTRACT

A light emitting device includes a substrate, multiple n-type layers, and multiple p-type layers. The n-type layers and the p-type layers each include a group III nitride alloy. At least one of the n-type layers is a compositionally graded n-type group III nitride, and at least one of the p-type layers is a compositionally graded p-type group III nitride. A first ohmic contact for injecting current is formed on the substrate, and a second ohmic contact is formed on a surface of at least one of the p-type layers. Utilizing the disclosed structure and methods, a device capable of emitting light over a wide spectrum may be made without the use of phosphor materials.

17 Claims, 4 Drawing Sheets

Related U.S. Application Data continuation of application No. 13/541,836, filed on Jul. 5, 2012, now Pat. No. 9,029,867.

(60) Provisional application No. 61/505,954, filed on Jul. 8, 2011.

(51) Int. Cl.
| | | |
|---|---|---|
| *H01L 33/02* | (2010.01) | |
| *H01L 33/06* | (2010.01) | |
| *H01L 33/12* | (2010.01) | |
| *H01L 33/00* | (2010.01) | |
| *H01L 33/62* | (2010.01) | |

(52) U.S. Cl.
CPC ............ *H01L 33/025* (2013.01); *H01L 33/06* (2013.01); *H01L 33/12* (2013.01); *H01L 33/325* (2013.01); *H01L 33/62* (2013.01); *H01L 29/7787* (2013.01)

(56) References Cited

U.S. PATENT DOCUMENTS

| | | |
|---|---|---|
| 6,404,791 B1 | 6/2002 | Yang |
| 6,515,313 B1 | 2/2003 | Ibbetson et al. |
| 6,667,498 B2 | 12/2003 | Makimoto et al. |
| 7,675,076 B2 | 3/2010 | Otsuka et al. |
| 8,030,641 B2 | 10/2011 | Tansu et al. |
| 9,029,867 B2 * | 5/2015 | Walukiewicz ........ H01L 29/778 257/103 |
| 9,312,430 B2 | 4/2016 | Walukiewicz et al. |
| 2013/0140525 A1 | 6/2013 | Chen et al. |
| 2013/0307027 A1 | 11/2013 | Lu et al. |
| 2014/0027779 A1 | 1/2014 | Hwang et al. |

OTHER PUBLICATIONS

Korean Intellectual Property Office; PCT Written Opinion of the International Searching Authority; Issued for Application No. PCT/US2012/045482; dated Dec. 21, 2012; 5 pages; Korea.

Matthews, J.W., et al.; Defects in epitaxial multilayers: 1. Misfit dislocation; J. Crystal Growth, vol. 27; Dec. 1974; pp. 118-125.

Sinivasan, S., et al.; Slip systems and misfit dislocations in InGaN epilayers; Appl. Phys. Lett.; vol. 82, No. 25; Dec. 2003; pp. 5187-5189.

Park, S. et al.; Strain relaxation in InxGa1-xN epitaxial films grown coherently on GaN; J. Crystal Growth; vol. 249, No. 3-4; Mar. 2003; pp. 445-460.

Lu. W. et al.; Generation and behavior of pure-edge threading misfit dislocations in InxGa1-xN/GaN multiple quantum wells; J. Appl. Phys.; vol. 96, No. 9; Nov. 2004; pp. 5267-5270.

* cited by examiner

MULTI-COLOR LIGHT EMITTING DEVICES WITH COMPOSITIONALLY GRADED CLADDING GROUP III-NITRIDE LAYERS GROWN ON SUBSTRATES

CROSS-REFERENCE TO RELATED APPLICATIONS

This is a continuation of U.S. Non-Provisional application Ser. No. 14/704,222, filed May 5, 2015, and entitled "Multi-Color Light Emitting Devices with Compositionally Graded Cladding Group III-Nitride Layers Grown on Substrates," by Walukiewicz et al., which is a continuation of U.S. Non-Provisional application Ser. No. 13/541,836, filed Jul. 5, 2012, which claims priority to U.S. Provisional Patent Application No. 61/505,954, filed Jul. 8, 2011. The entire contents of these applications are incorporated by reference as is fully set forth herein.

BACKGROUND OF THE INVENTION

Field of the Invention

The disclosure relates to a light emitting device (LED) based on group III-nitride semiconductors grown on Si substrates capable of emitting light over a wide spectrum, e.g., from ultra-violet to near-infrared.

Background Discussion

Light emitting diodes (LEDs) are semiconductor devices having P—N junctions which, when appropriately connected to a power supply, generate light. The high efficiency of the light generation in the short wavelength part of the light spectrum (e.g., ultra-violet and blue) has prompted the use of LEDs in many applications, including simple character or signal displays and more complex colored image displays. The use of LEDs for flashlights, brake lamps, signboards, etc, is well known. The current technique for the creation of colored light relies on the UV or blue emission of the nitride-based LEDs to excite phosphor granules embedded in an epoxy dome that, in turn, could generate green or red light. To generate white light, the blue light of the LED is mixed with the green and red emissions of phosphor granules. This technique, however, has low efficiency at the phosphor level and the epoxy encapsulant tends to degrade, thereby degrading the transparency due the interaction with high energy blue light. The emergence of white LEDs as potential sources for illumination, expected to replace conventional incandescent and fluorescent lighting, is based on the demonstrated high efficiency in the short wavelength spectrum, on the relative long lifetime and reliability of the devices, and on their simple and versatile control, potentially allowing color adjustments, just to mention a few of LEDs' advantages. However, it has been found that the high conversion efficiency of nitride LEDs cannot be easily extended toward wavelengths longer than blue, and this situation has become known in the literature as "the green gap."

Current LED operation is based on the fabrication of a multi-quantum well structure (MQW) in the active volume of the device that is sandwiched between n-type gallium nitride (n-GaN) and p-type gallium nitride (p-GaN) regions. The MQWs are also a succession of high band gap/low band gap layers of nanometer size, typically GaN/InGaN, that create within the quantum well intermediate energy levels between that of the high and low band gap of the material system. The distribution of the intermediate energy levels defines the device color and depends on the geometric parameters of the MQW structure as well as on the band gap levels of the component materials. Green color, for example, extends in the range of wavelengths from 495 nm to 570 nm. For the middle of the green domain range (~532 nm), a nitride GaN/InGaN semiconductor alloy system would have the lowest material gap of about or lower than 2.33 eV. This band gap requires a fraction of at least 29% indium in the composition of InGaN.

To exhibit high quantum efficiency, the formation of carrier recombination centers, such as misfit or threading dislocations, has to be avoided. Misfit strain arises from the difference between the in-plane lattice parameters of the epilayers. A basic concept in the epitaxial growth is that for very thin layers it is energetically favorable to accommodate the misfit strain elastically, while for thicker epilayers the strain is accommodated by introducing defects such as misfit dislocations. For this reason, the alternating layers are grown pseudomorphically, which requires the thickness of each of the alternating layers to remain below the limit at which the atomic bonds break and dislocations are formed. This limit is known as the critical thickness. The difficulty in the epitaxial fabrication of such a MQW system relates to the elastic properties of the InGaN/GaN layer system. According to various models, such as the van der Merwe model (e.g., Matthews, J. W. and Blakeslee, A. E., "Defects in epitaxial multilayers: 1. misfit dislocations," J. Crystal Growth, Vol. 27, December 1974, pp. 118-125, incorporated herein in its entirety), the force balance model (e.g., Srinivasan, S., Geng, L., Liu, R., Ponce, F. A., Narukawa, Y., and Tanaka, S., "Slip systems and misfit dislocations in InGaN epilayers," Appl. Phys. Lett., Vol. 83, No. 25, December, 2003, pp. 5187-5189, incorporated herein in its entirety), or the energy balance model (e.g., Park, S.-E., O, B., and Lee, C.-R., "Strain relaxation in InxGa1-xN epitaxial films grown coherently on GaN," J. Crystal Growth, Vol. 249, No. 3-4, March 2003, pp. 455-460, and Lu, W., Li, D. B., Li, C. R., and Zhang, Z., "Generation and behavior of pure-edge threading misfit dislocations in InxGa1-xN/GaN multiple quantum wells," J. Appl. Phys., Vol. 96, No. 9, November 2004, pp. 5267-5270, incorporated herein in their entirety), the critical thickness decreases with the increase of the indium fraction. The force balance and energy balance models both predict a critical thickness smaller than 2 nm for an Indium fraction of 30%, that decreases further with the increase of the Indium fraction. Experimental data suggests a critical thickness of approximately 3 nm at a 20% Indium fraction, a value that is lower than the approximate 6 nm value predicted by the aforementioned force balance or energy balance models. These results suggest that the fabrication of MQW LEDs having quantum wells with Indium fractions in the range of 30% or larger is associated with the increase of the misfit and threading dislocation density—non-radiative defects—and a sudden decrease of the overall radiative carrier recombination efficiency, phenomenon known as the green gap.

DETAILED DESCRIPTION OF INVENTION

One or more embodiments of the present disclosure are directed to a light emitting device (LED) capable of emitting light over a wide spectrum, from ultra-violet to near-infrared, without the use of phosphor materials, based on three recent advancements: (1) progress in the growth of group III-nitrides on Si substrates; (2) successful formation of p/n junctions in partially phase-separated InGaN; and (3) improved ability to grow compositionally graded n-type and p-type layers of InGaN, with a composition range from 0% to 40% In. Various embodiments are described herein using the case of InGaN alloys, but the present teachings are also applicable to InAlN ternary or InGaAlN quaternary alloys. Further, while various embodiments are described herein using the case of group III-nitrides formed on Si substrates, the present teachings could in principle be formed on other substrates, such as sapphire or SiC, with properly modified growth conditions.

Figure 1:
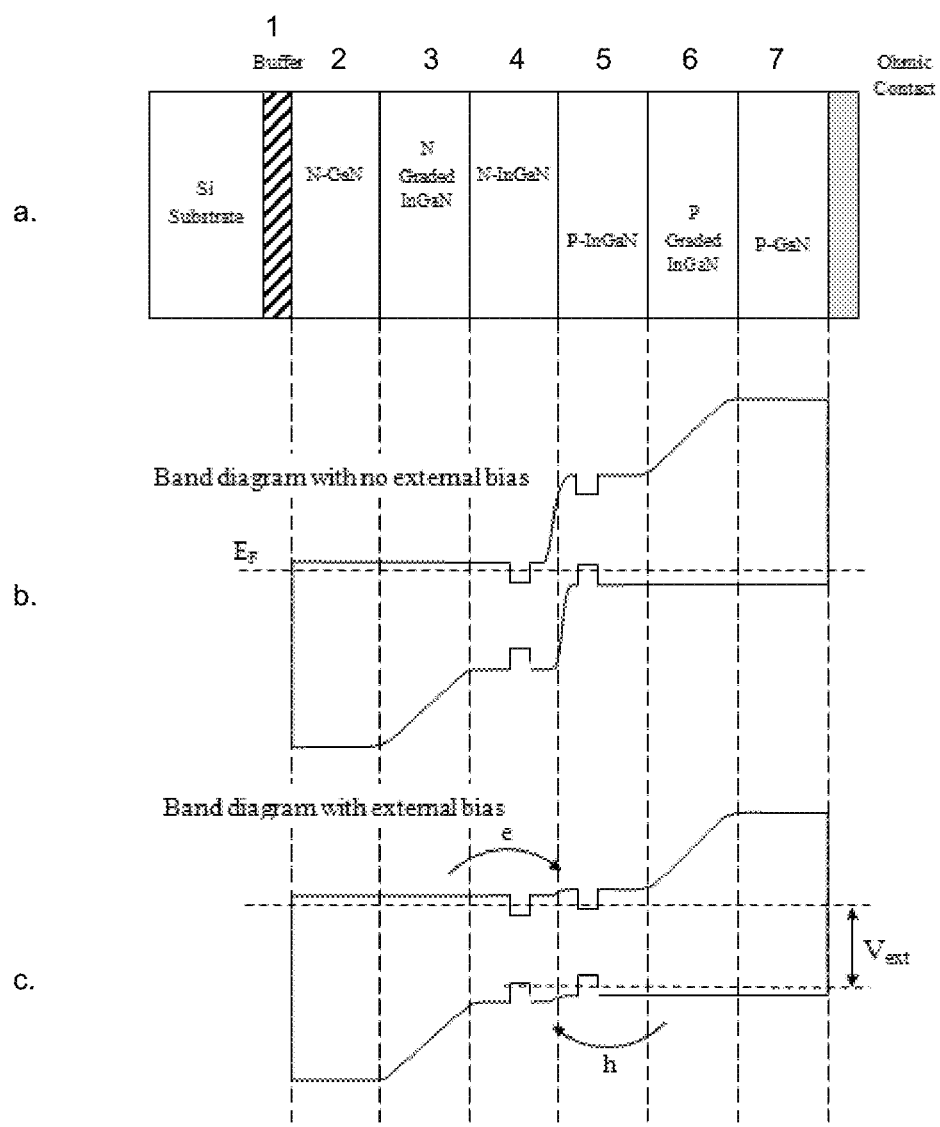
FIG. 1 shows a schematic cutaway side view illustrating a layer structure according to an embodiment of the invention, along with band diagrams showing properties of individual layers with and without external bias.

In a first embodiment, the basic structure of the new light emitting device consists of a heavily doped (e.g., doped at $5 \times 10^{18} - 2 \times 10^{19}$ cm$^{-3}$) p-type Si (111) substrate followed by a buffer layer, as shown in FIG. 1. In FIG. 1, section a shows the layer structure of the light emitting from the device, section b shows a band diagram with no bias applied, and section c shows a band diagram with external bias, $V_{ext}$. While the buffer layer in the illustrated embodiment consists of a thin AlN nucleation layer, any other suitable nucleation layer may be utilized. The buffer layer is followed by an n-type GaN layer. In one embodiment, the n-type GaN layer is doped at $10^{18} - 10^{19}$ cm$^{-3}$. The GaN layer is followed by an n-type InGaN layer graded from GaN to a target InGaN composition having a desired percentage of In. In one embodiment, the GaN layer is followed by an n-type InGaN layer graded from GaN to a target InGaN composition having 40% In on average. However, it should be noted that the target composition depends on the desired LED color range. The graded n-type InGaN layer is followed by an n-type InGaN layer and a p-type InGaN layer of the target composition (i.e., the target InGaN composition having a desired percentage of In). The p/n junction is formed in the InGaN of the target composition or in the graded n-type region. The alloy composition and/or the thickness of the InGaN p/n junction is adjusted to optimize the intensity and to select the wavelength of the emitted light. For example, the parameters of the target composition of the InGaN p/n junction can be adjusted to allow the device to be tuned to produce Green and longer wavelength LEDs or other multicolor and/or white light spectrums. The p/n InGaN layers of the constant target composition are followed by a p-type InGaN layer graded from the target InGaN composition to GaN (i.e., the final grading is absent In).

Finally the structure is capped with a layer of p-type GaN. An ohmic contact (not shown) for injecting current is formed on the back of the p-Si substrate using a metal deposition. A top ohmic contact is formed on the top surface of the p-type GaN layer. This top contact to the p-type GaN can be made using a semi-transparent NiAl layer, a metallic grid or a transparent conducting oxide (TCO). Details as to the formation of ohmic contacts can be found in PCT Patent Application No. PCT/US2008/004572 entitled "Low Resistance Tunnel Junctions for High Efficiency Tandem Solar Cells" filed Apr. 9, 2008, and in U.S. Provisional Patent Application No. 60/910,734 filed Apr. 9, 2007, the entire disclosures of which are incorporated herein by reference. In these disclosures, the inventors teach how p-type Si forms a low resistance ohmic contact with n-type InGaN. In the context of the present invention, this will facilitate the electrical contact from the substrate to the active device.

In one or more embodiments, the group III-nitride layers (or other layers) are deposited using molecular beam epitaxy (MBE) techniques, but it is understood that the various layers can also be deposited using metal-organic chemical vapor deposition (MOCVD), hydride vapor phase epitaxy (HVPE), remote plasma chemical vapor deposition (RP-CVD), or any other appropriate deposition method.

The energy band diagram of the device structure is schematically shown in FIG. 1 at section b. The graded region on the n-type side of the device structure confines the holes whereas the graded region on the p side confines the electrons.

InGaN undergoes phase separation into the regions of larger and smaller In content. The phase separation is especially severe at high In content, e.g., greater than 30% In content. The origin of this phenomenon is not well established. However, there are indications that it could be attributed to the higher chemical binding energy of GaN compared with InN molecule. Consequently, with higher Ga content, e.g., greater than 60% Ga, larger band gap regions will be formed at growth initiation regions such as grain boundaries and dislocations, whereas with large In content, e.g., greater than 30% In, small band gap regions will be removed away from such internal surfaces. This also leads to spatial variations of the carrier lifetime as the regions close to the grain boundaries and/or dislocations have larger densities of non-radiative recombination centers. Clusters with larger In content are exemplary indicated as a few wells in the band diagrams in FIG. 1 at sections b and c, and in FIG. 4 at sections b and c.

When, as shown in FIG. 1 at section c, the device structure is forward biased, the electrons (e) and holes (h) are injected into the InGaN region. They tend to agglomerate in the high In, low band gap regions. The observed electroluminescence (EL) energy is expected to be lower than that predicted by the average composition. Also, the EL should be more efficient because of the lower density of non-radiative centers in the In-rich region.

Figure 2:
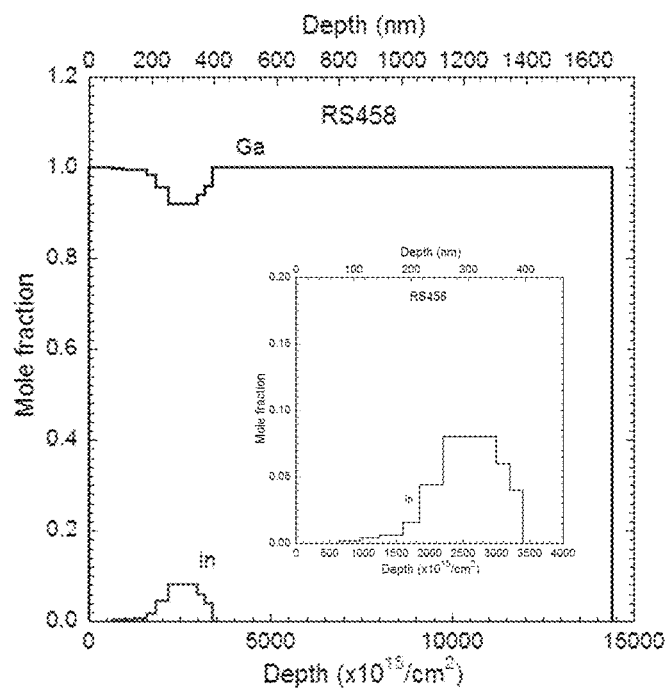
FIG. 2 shows a measured composition profile of a synthesized LED structure in accordance with an embodiment of the invention.
Figure 3:
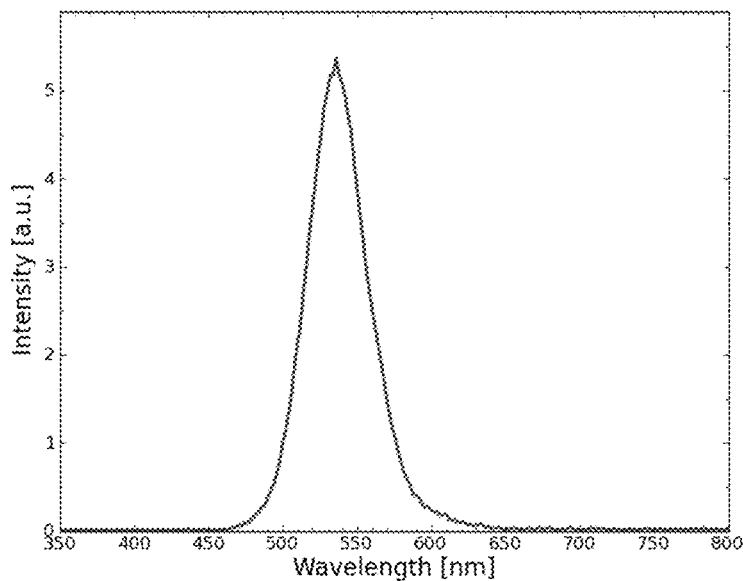
FIG. 3 shows a diagram of the emission intensity vs. wavelength for the LED structure shown in FIG. 2., The electroluminescence spectrum shows a peak with a wavelength of 540 nm (2.3 eV) in the green part of the visible spectrum.

The present inventors have grown and tested several device structures as shown in FIG. 1 at section a. The testing included a composition variation measured by Rutherford Backscattering Spectroscopy (RBS), with the results of such testing shown in FIG. 2. In particular, FIG. 2 shows a composition profile of an LED structure in accordance with an embodiment of the invention, as determined by RBS. In the insert, maximum average indium fraction determined in the InGaN region is ~8%. The p/n junction in the InGaN layer was fabricated using Mg doping. The average In composition of the InGaN junction region was 8% (i.e., the target InGaN composition possessed 8% In). However, EL measurements of this device structure have shown, as illustrated in FIG. 3, a strong peak at 2.3 eV in the green range of the visible spectrum (540 nm).

This emission energy corresponds to much larger In content of 30%. The low energy EL indicates phase separation and formation of clusters with In composition of 30%, which is larger than the average In content of 8%. In accordance with one or more embodiments, a key advantage here is that the p/n junction is formed in the InGaN target layer before the top graded layer. The rectifying properties are determined by the low In composition (majority) phase, whereas emission properties are mainly determined by high In composition (minority) phase (i.e. a large band gap diode is used to produce lower energy photons).

Figure 4:
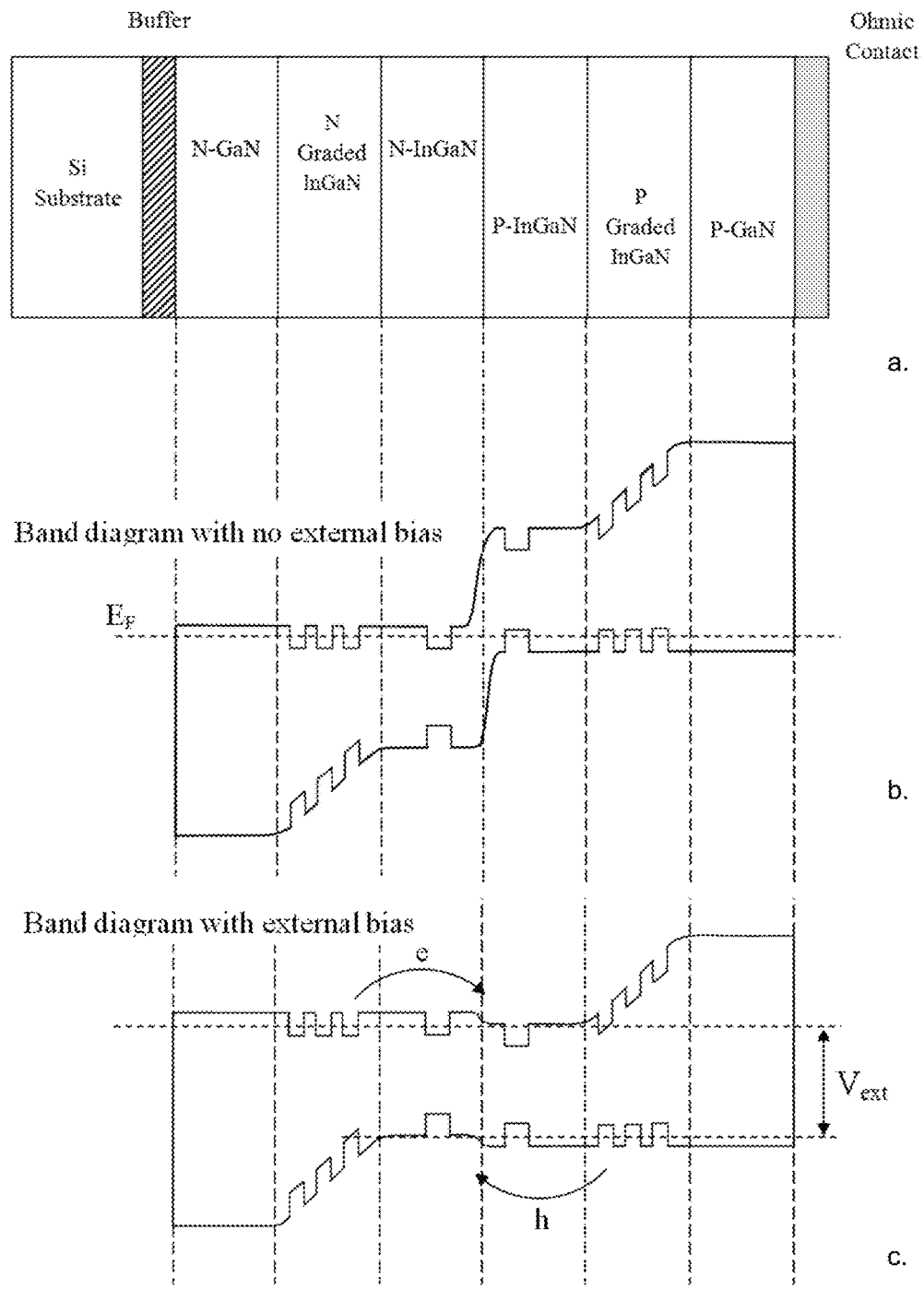
FIG. 4 shows a schematic cutaway side view illustrating a layer structure according to an embodiment of the invention, along with band diagrams showing properties of individual layers with and without external bias.
Figure 5:
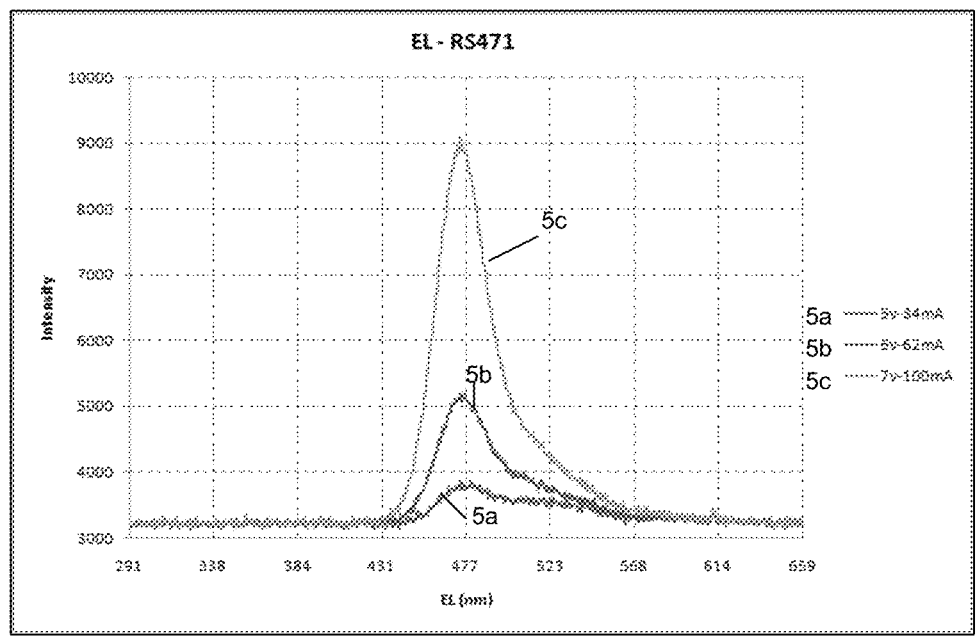
FIG. 5 shows a diagram of electroluminescence intensity vs. photon wavelength for a graded p-n junction LED under increasing forward bias.

For structures grown under different conditions, the phase separation extends into the InGaN graded regions, toward the lower indium fraction InGaN, as is the case in the embodiment illustrated in FIG. 4. In FIG. 4, section a shows the layer structure of a second embodiment of the device, and sections b and c show band diagrams with no external bias applied and with applied external bias applied, respectively. In this case, when the device structure is forward biased, at low bias values, e.g., less than 3V, the electron-hole recombination will take place predominantly across the low band gap InGaN clusters generating light with long wavelengths. As the forward bias is increased, the carriers will be injected into larger band gap regions, shifting the emission from long to shorter wavelength. This operation of the graded p-n junction LED is demonstrated by the electroluminescence measurements under increasing bias presented in FIG. 5. This demonstrates the tunability of the improved LEDs described herein to multi-color and white light spectrums.

The above-described embodiments are not limited to the specific alloy compositions described. Judicious choice of the average composition and the growth conditions will allow fabrication of devices emitting light from red to blue providing basic components for light generation covering the full visible spectrum.

In accordance with one or more embodiments of the LED described herein, a long wavelength LED device is provided that utilizes low cost silicon wafer substrates. Low cost Green and longer wavelength LEDs have been sought after by both science and industry for an extensive period of time because they would fill a high-value gap in the rapidly growing global LED market for lighting and illumination where energy efficiency and miniaturization is paramount to the global renewable energy momentum. Green or longer wavelength nitride based LEDs are very challenging to fabricate compared to UV and Blue LEDs due to decreasing quantum efficiencies and have remained a tough milestone for the LED industry. In accordance with one or more embodiments of the LEDs described herein, efficient long wavelength LEDs are provided that allow for the achievement of essential milestones in the roadmap for Solid State Lighting (SSL), LED backlighting and next generation display technology.

One application of the present invention is in photovoltaic devices. For example, the present invention may be used in combination with photovoltaic devices having three-dimensional charge separation and collection, such as those taught in U.S. patent application Ser. No. 13/312,780 entitled "Photovoltaic Device With Three Dimensional Charge Separation And Collection" filed Dec. 6, 2011, the entire disclosure of which is incorporated herein by reference. In the referenced application, the inventors teach using a graded InGaN p/n junction for a charge separation in a photovoltaic device.

The above embodiments and preferences are illustrative of the present invention. It is neither necessary, nor intended for this patent to outline or define every possible combination or embodiment. The inventor has disclosed sufficient information to permit one skilled in the art to practice at least one embodiment of the invention. The above description and drawings are merely illustrative of the present invention and that changes in components, structure and procedure are possible without departing from the scope of the present invention as defined in the following claims. For example, elements and/or steps described above and/or in the following claims in a particular order may be practiced in a different order without departing from the invention. Thus, while the invention has been particularly shown and described with reference to embodiments thereof, it will be understood by those skilled in the art that various changes in form and details may be made therein without departing from the spirit and scope of the invention

The invention claimed is:

1. A light emitting device capable of emitting light, comprising:
    a substrate;
    a plurality of n-type layers, each comprising a group III nitride alloy, wherein said plurality of n-type layers comprise at least one layer of n-type graded group III nitride; and
    a plurality of p-type layers, each comprising a group III nitride alloy, wherein said plurality of p-type layers comprise at least one layer of p-type graded group III nitride.

2. The light emitting device according to claim 1, wherein an alloy composition and/or the thickness of an InGaN p/n junction is adjusted to optimize the intensity and to select the wavelength of the emitted light.

3. The light emitting device according to claim 1, wherein the group III nitride alloy comprises InGaN.

4. The light emitting device according to claim 1, wherein the group III nitride alloy comprises an InAlN ternary alloy.

5. The light emitting device according to claim 1, wherein the group III nitride alloy comprises an InGaAlN quaternary alloy.

6. The light emitting device according to claim 1, wherein the substrate comprises silicon.

7. The light emitting device according to claim 1, wherein the substrate comprises p-type silicon.

8. The light emitting device according to claim 1, wherein the substrate comprises sapphire.

9. The light emitting device according to claim 1, wherein the substrate comprises silicon carbide.

10. The light emitting device according to claim 1, wherein a p/n junction is formed in InGaN of a target composition.

11. The light emitting device according to claim 1, wherein a p/n junction is formed in a compositionally graded n-type region.

12. A light emitting device based on group III-nitride semiconductors grown on a substrate, said light-emitting device comprising one or more p-type compositionally graded group III nitride layers and one or more n-type compositionally graded group III nitride layers.

13. A light emitting device comprising:
    a heavily doped p-type Si substrate;
    a buffer layer formed on the p-type Si substrate;
    an n-type GaN layer formed on the buffer layer;
    a compositionally graded n-type InGaN layer formed on the n-type GaN layer and graded from GaN to a target InGaN composition having a desired percentage of In;
    an n-type InGaN layer formed on the compositionally graded n-type InGaN layer and a p-type InGaN layer formed on the n-type InGaN layer, wherein the n-type and p-type InGaN layers comprise the target InGaN composition and form a p/n junction;

a graded p-type InGaN layer formed on the p-type InGaN layer and graded from the target InGaN composition to GaN; and a p-type GaN layer formed on the graded p-type InGaN layer.

14. The light emitting device according to claim 13, wherein the buffer layer comprises a nucleation layer.

15. The light emitting device according to claim 14, wherein the nucleation layer comprises a thin AlN nucleation layer.

16. The light emitting device according to claim 1, further comprising an ohmic contact formed on the substrate.

17. The light emitting device according to claim 13, further comprising an ohmic contact formed on the p-type GaN layer.

* * * * *